US007120804B2

(12) United States Patent
Tschanz et al.

(10) Patent No.: US 7,120,804 B2
(45) Date of Patent: Oct. 10, 2006

(54) METHOD AND APPARATUS FOR REDUCING POWER CONSUMPTION THROUGH DYNAMIC CONTROL OF SUPPLY VOLTAGE AND BODY BIAS INCLUDING MAINTAINING A SUBSTANTIALLY CONSTANT OPERATING FREQUENCY

(75) Inventors: James W. Tschanz, Portland, OR (US); Yibin Ye, Portland, OR (US); Liqiong Wei, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 519 days.

(21) Appl. No.: 10/328,573

(22) Filed: Dec. 23, 2002

(65) Prior Publication Data

US 2004/0123170 A1  Jun. 24, 2004

(51) Int. Cl.
*G06F 1/26* (2006.01)
*H03K 3/01* (2006.01)

(52) U.S. Cl. .................. 713/300; 713/320; 327/534
(58) Field of Classification Search ............... 713/300, 713/320; 327/544, 534, 537; 326/33
See application file for complete search history.

(56) References Cited

U.S. PATENT DOCUMENTS

| 5,610,533 | A | * | 3/1997 | Arimoto et al. ............... 326/33 |
| 5,672,995 | A | * | 9/1997 | Hirase et al. ................ 327/534 |
| 5,751,603 | A | | 5/1998 | Landolf |
| 5,953,237 | A | | 9/1999 | Indermaur et al. |
| 6,097,243 | A | * | 8/2000 | Bertin et al. ................. 327/544 |
| 6,100,751 | A | | 8/2000 | De et al. .................... 327/534 |
| 6,300,819 | B1 | | 10/2001 | De et al. .................... 327/534 |
| 6,366,156 | B1 | | 4/2002 | Narendra et al. ............ 327/534 |
| 6,411,156 | B1 | * | 6/2002 | Borkar et al. ............... 327/534 |
| 6,415,388 | B1 | | 7/2002 | Browning et al. |
| 6,429,726 | B1 | | 8/2002 | Bruneau et al. ............. 327/537 |
| 6,448,840 | B1 | * | 9/2002 | Kao et al. ................... 327/534 |
| 6,484,265 | B1 | | 11/2002 | Borkar et al. |
| 6,653,890 | B1 | * | 11/2003 | Ono et al. ................... 327/537 |
| 6,967,522 | B1 | * | 11/2005 | Chandrakasan et al. .... 327/534 |
| 2002/0079951 | A1 | | 6/2002 | Borkar et al. |
| 2002/0083355 | A1 | | 6/2002 | Clark et al. |
| 2002/0138777 | A1 | | 9/2002 | Feierbach |
| 2002/0138778 | A1 | | 9/2002 | Cole et al. |
| 2002/0147932 | A1 | | 10/2002 | Brock et al. |

FOREIGN PATENT DOCUMENTS

EP          0 666 528 A1     8/1995

(Continued)

OTHER PUBLICATIONS

Martin et al, Combined Dynamic Voltage Scaling and Adaptive Body Biasing for Lower Power Microprocessors under Dynamic Workloads, Nov. 10-14, 2002, IEEE/ACM, pp. 721-725.*

(Continued)

*Primary Examiner*—Thomas Lee
*Assistant Examiner*—Suresh K Suryawanshi
(74) *Attorney, Agent, or Firm*—Cynthia Thomas Faatz

(57) ABSTRACT

An approach for power reduction of an integrated circuit device. In response to detecting a change in an activity factor associated with an integrated circuit device from a first activity factor to a second activity factor, a supply voltage and a body bias associated with the integrated circuit device are adjusted based on the second activity factor to reduce power consumption. For one aspect, the supply voltage and body bias are adjusted to maintain a substantially constant operating frequency for the integrated circuit device.

27 Claims, 4 Drawing Sheets

FOREIGN PATENT DOCUMENTS

| | | |
|---|---|---|
| EP | 1 117 031 A1 | 7/2001 |
| WO | WO 01/48584 A1 | 7/2001 |

OTHER PUBLICATIONS

Kim et al, Dynamic Vth Scaling for Active Leakage Power Reduction, Mar. 4-8, 2002, IEEE, pp. 5.*

Anantha Chandrakasan, Rex Min, Manish Bhardwaj, Seong-Hwan Cho, and Alice Wang *"Power Aware Wireless Microsensor Systems"*, ESSCIRC, Florence, Italy, Sep. 2002.

A 175 mV multiply-accumulate unit using an adaptive supply voltage and body bias (ASB) architecture, Chandrakasan, A.P.; Kao, J.; Miyazaki, M.; Solid-State Circuits Conference, 2002. Digest of Technical Papers. ISSCC. 2002 IEEE International, vol. 1, 2002, pp. 58-444 vol. 1.

A dynamic voltage scaled microprocessor system, Brodersen, R.; Burd, T.; Pering, T.; Stratakos, A.; Solid-State Circuits Conference, 2000. Digest of Technical Papers. ISSCC. 2000 IEEE International, 2000, pp. 294-295, 466.

Effectiveness of reverse body bias for leakage control in scaled dual Vt CMOS ICs Bloechel, B.; Borkar, S.; De, V.; Ghani, T.; Keshavarzi, A.; Ma, S:; Mistry, K.; Narendra, S.; Low Power Electronics and Design, International Symposium on, 2001., 2001 pp. 207-212.

Ricardo Gonzalez, Benjamin M. Gordon, Mark A. Horowitz, "Supply and Threshold Voltage Scaling for Low Power CMOS", 1997 IEEE Journal of Solid-State Circuits, vol. 32, No. 8, Aug. 1997, pp. 1210-1216.

PCT Invitation to Pay Additional Fees for PCT International Application No. US03/39133 mailed Oct. 12, 2004 (5 pages).

* cited by examiner

| Vcc 1 | Vb 1 |
|---|---|
| Vcc 2 | Vb 2 |
| ⋮ | ⋮ |
| Vcc N | Vb N |

METHOD AND APPARATUS FOR REDUCING POWER CONSUMPTION THROUGH DYNAMIC CONTROL OF SUPPLY VOLTAGE AND BODY BIAS INCLUDING MAINTAINING A SUBSTANTIALLY CONSTANT OPERATING FREQUENCY

BACKGROUND

An embodiment of the present invention relates to the field of integrated circuits, and, more particularly, to an approach for reducing power consumption of integrated circuits.

Power consumption of integrated circuits and, in particular, complex integrated circuits, such as microprocessors, is becoming a significant concern. This is especially true for current and future technology generations for which leakage power consumption is a significant percentage of total power consumption.

For some prior approaches, to address this issue, the frequency and supply voltage of a processor are both varied according to an activity level of the processor in order to reduce power while maintaining a relatively constant perceived throughput. This approach, however, typically requires changes to the operating system to predict when high-frequency operation will be necessary. At the same time, continually changing the clock frequency adds complexity to the design.

BRIEF DESCRIPTION OF THE DRAWINGS

The present invention is illustrated by way of example and not limitation in the figures of the accompanying drawings in which like references indicate similar elements, and in which.

DETAILED DESCRIPTION

A method and apparatus for reducing power consumption through dynamic control of supply voltage and body bias are described. In the following description, particular types and/or configurations of integrated circuit devices, circuits and systems are described for purposes of illustration. It will be appreciated, however, that other embodiments are applicable to other types and/or configurations of integrated circuit devices, circuits, and/or systems.

As described herein, total power consumption of an integrated circuit device or chip is a function of activity factor, which may be associated with, for example, the number of units on the chip that are actively performing calculations or operations at a given time or another indicator of the activity level of the chip. When the activity factor of an integrated circuit device is relatively low, a larger percentage of the total power consumption is attributed to leakage power, while when the activity factor is relatively high, a larger percentage of the total power consumption is switching power consumption due to the charging and discharging of circuit capacitances. Switching power is strongly affected by the supply voltage of the integrated circuit of interest, while leakage power is strongly affected by the threshold voltages of the transistors of the integrated circuit of interest.

Figure 1:
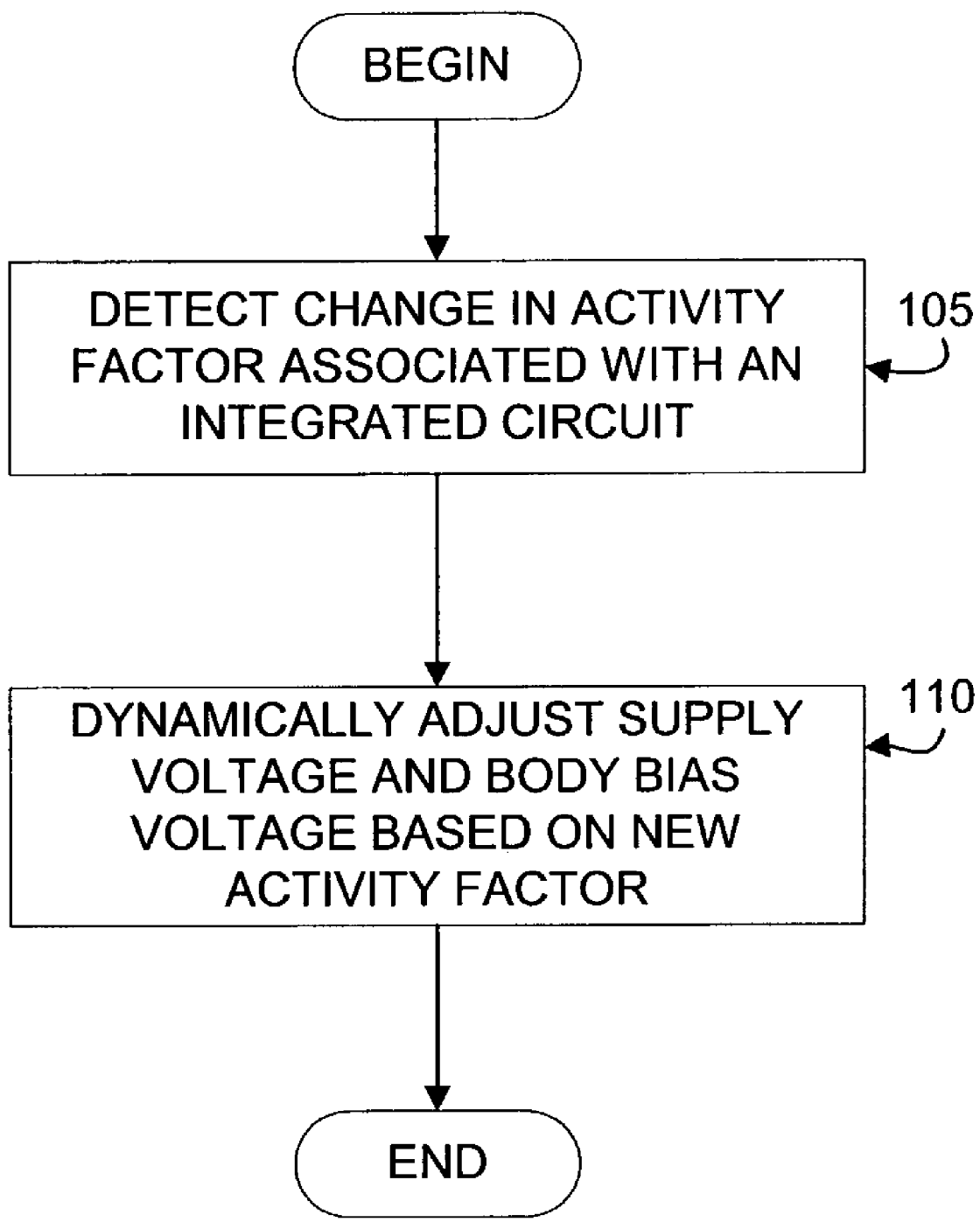
FIG. 1 is a flow diagram showing a method of one embodiment for power reduction for an integrated circuit device using dynamic control of supply voltage and body bias.

Thus, referring to FIG. 1, for one embodiment, in response to detecting a change in an activity factor associated with an integrated circuit device at block 105, a supply voltage and a body bias associated with the integrated circuit device are dynamically adjusted based on the new activity factor at block 110. Both the supply voltage and transistor threshold voltage(s) (via body bias) are dynamically adjusted to new values to reduce the overall power consumption of the integrated circuit, while maintaining performance (e.g. operating frequency) in a way that is effectively transparent to the user and the operating system. Details of this and other embodiments are provided in the description that follows.

Figure 2:
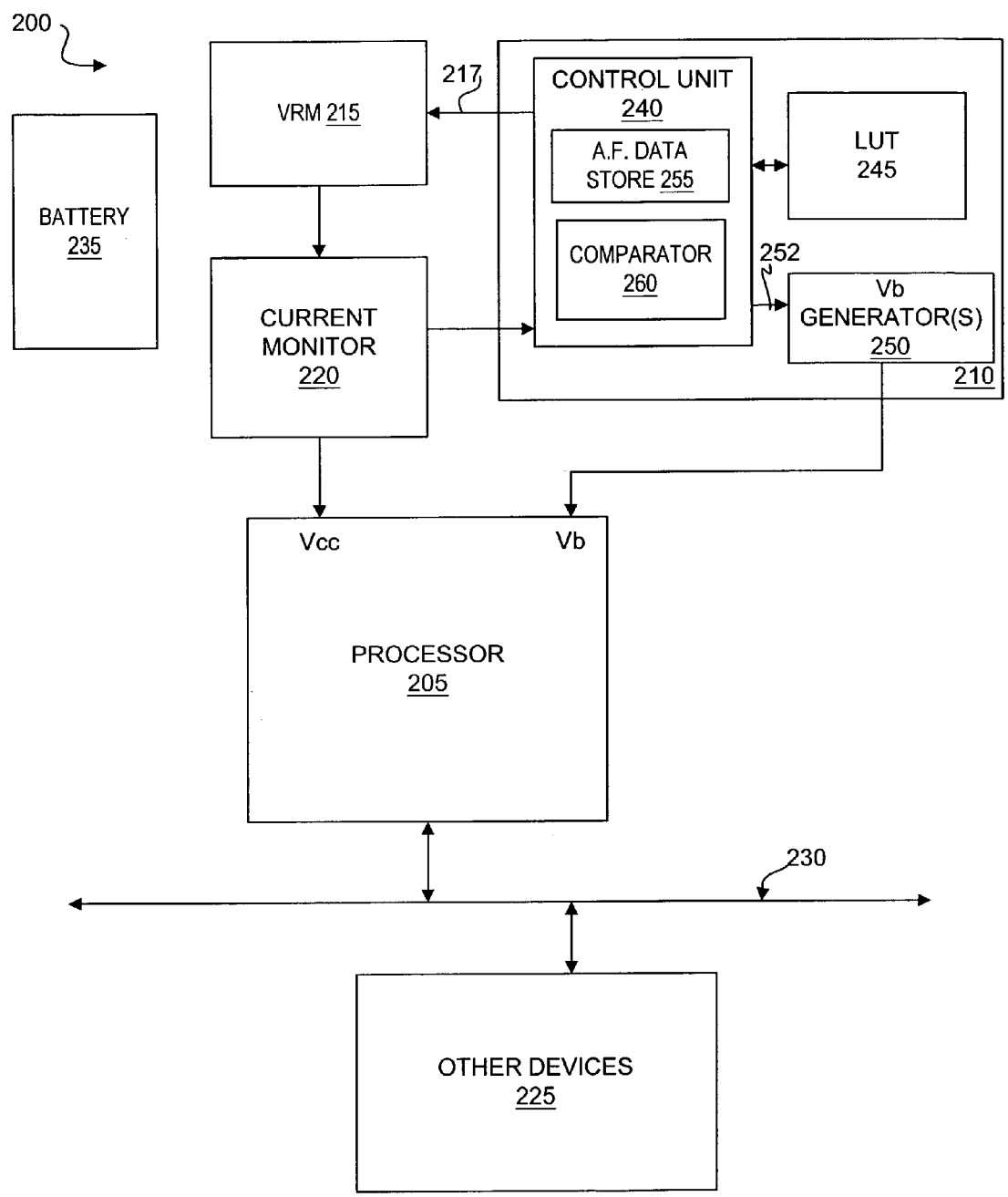
FIG. 2 is a block diagram of an exemplary system in which the power reduction approach of one embodiment may be advantageously implemented.

FIG. 2 is a block diagram of an exemplary system 200 that may implement power reduction using dynamic supply voltage and body bias control in accordance with one embodiment. The exemplary system 200 includes a processor 205, a dynamic supply and body bias controller 210, a voltage regulator module (VRM) 215, and a current monitor 220.

For the exemplary system 200, the processor 205 may also be coupled to other devices 225 such as, for example, a memory controller, an input/output controller, one or more mass storage devices, input and/or output device(s), graphics-related device(s), memory, etc. via a one or more buses 230.

A battery 235 may also be included in the system 200 (connections not shown in FIG. 2) to provide an alternate power source for some embodiments, particularly where the system 200 is a mobile system such as a laptop, notebook, handheld or other type of mobile or portable computer system.

The VRM 215 has an output coupled to provide a supply voltage Vcc to the processor 205 that may be varied depending on the activity factor of the processor 205 as described in more detail below. For one embodiment, the VRM 215 may be any available voltage regulator module that is capable of providing a variety of supply voltages within a desired range, with a desired resolution and current as described in more detail below. The supply voltage provided by the VRM 215 may be varied in response to receiving control information at one or more inputs over a bus 217, or in another manner.

The current monitor 220 of one embodiment has an input coupled to an output of the VRM 215 to regularly monitor the current drawn by the processor 205 and an output coupled to provide the supply voltage Vcc to the processor 205. The current monitor 220 may be implemented using any available current monitor that provides the capabilities described below, including detecting variations in current to a desired resolution and at a desired sampling frequency. While the current monitor 220 is shown as a standalone device, for some embodiments, the current monitor 220 may be integrated into, for example, one of the voltage regulator module 215, the dynamic supply and body bias controller 210, or the processor 205 for other embodiments.

The supply voltage and body bias controller 210 is coupled to the current monitor 220, the VRM 215 and the processor 205 as shown. The dynamic supply and body bias controller 210 of one embodiment includes a control unit 240, a voltage look-up table (LUT) 245 and one or more body bias voltage (Vb) generator(s) 250.

The control unit 240 of one embodiment may be implemented as a state machine, for example, that operates in the manner described below. One or more activity factor data stores 255, and a comparator 260 may be included as part of the control unit 240 or coupled to the control unit 240. For other embodiments, it will be appreciated that other types of units may be included in the controller 210 and/or one or more of the units 240, 245, 250, 255 and/or 260 may be provided as part of a different unit (such as, for example, the VRM 215), a different integrated circuit device and/or may be a standalone integrated circuit device.

The LUT 245 may be implemented using any type of programmable memory that provides the described capabilities. For example, for one embodiment, the LUT 245 is implemented using a read-only memory structure that is programmable using fuses. Other types of memories and programming approaches for providing the LUT 245 are within the scope of various embodiments.

The body bias generator(s) 250 has an output coupled to provide a body bias voltage Vb to the processor 205 and is capable of varying Vb depending on the activity factor of the processor 205. For one embodiment, a single Vb generator 250 is provided to vary the body bias of only one of n-type or p-type transistors. Where the processor 205 is fabricated on a complementary metal oxide semiconductor (CMOS) or other process that includes both n-type and p-type transistors, a characterization process may be performed to determine whether to vary the body bias of p-type or n-type transistors. For this example, the choice that produces the largest power savings using the dynamic supply voltage and threshold voltage variation approach described herein is selected.

For another embodiment, both N and P body bias generators are provided as the Vb generators 250 such that the threshold voltages of both n-type and p-type transistors on the processor 205 are dynamically adjusted as described below. For such embodiments, the N body bias generator provides an output voltage $Vb_N$, while the P body bias generator provides an output voltage $Vb_P$. In the description that follows, for embodiments that use both N and P body bias generators, the body bias generators are controlled and operate in a substantially similar manner. Where a single Vb generator is described, it will be appreciated that similar techniques may be used to control and operate multiple Vb generators.

For one embodiment, the Vb generator(s) 250 may be configured and operate in accordance with any currently known Vb generator that is capable of providing body bias voltages and current levels within a desired range and with a desired resolution that may be the same or different than the resolution of the VRM 215. For one embodiment, the body bias voltage Vb may be varied in response to receiving control information from the control unit 240 over a bus 252, for example. Examples of body bias generators that may be suitable for one or more embodiments, depending on the particular implementation, may be described or referenced in one or more of U.S. Pat. Nos. 6,100,751, 6,300,819, 6,366,156, 6,411,156, and 6,429,726, for example. Other types of body bias generators may be used for various embodiments.

With continuing reference to FIG. 2, for one embodiment, the processor 205 is a microprocessor that is targeted to operate at a given clock frequency. The processor 205 has a specified nominal supply voltage $Vcc_i$ and associated threshold voltage $Vth_i$ for most transistors (or $Vth_{tp}$ for p-type transistors and $Vth_{tn}$ for n-type transistors where both p and n type transistors are used), wherein the supply voltage $Vcc_i$ and threshold voltage(s) $Vth_i$ are typically determined, for example, by the maximum power constraints associated with the processor 205. The supply voltage $Vcc_i$ is less than the maximum supply voltage for the process used to manufacture the processor 205 by a sufficient amount such that the Vcc level may be adjusted as described below without exceeding the maximum supply voltage specified for the process. The maximum supply voltage for a process is typically determined based on a variety of quality and reliability factors in a manner well-known to those of ordinary skill in the art.

While the processor 205 is described for purposes of example as being a microprocessor, for other embodiments, the processor 205 may be a different type of processor such as a digital signal processor, a microcontroller, an embedded processor, a graphics processor, etc. It will be appreciated that, for other embodiments, a similar approach may be used to reduce power for other types of integrated circuits.

It will further be appreciated that other types of systems and/or systems configured in a different manner may be used for other embodiments.

Figure 5:
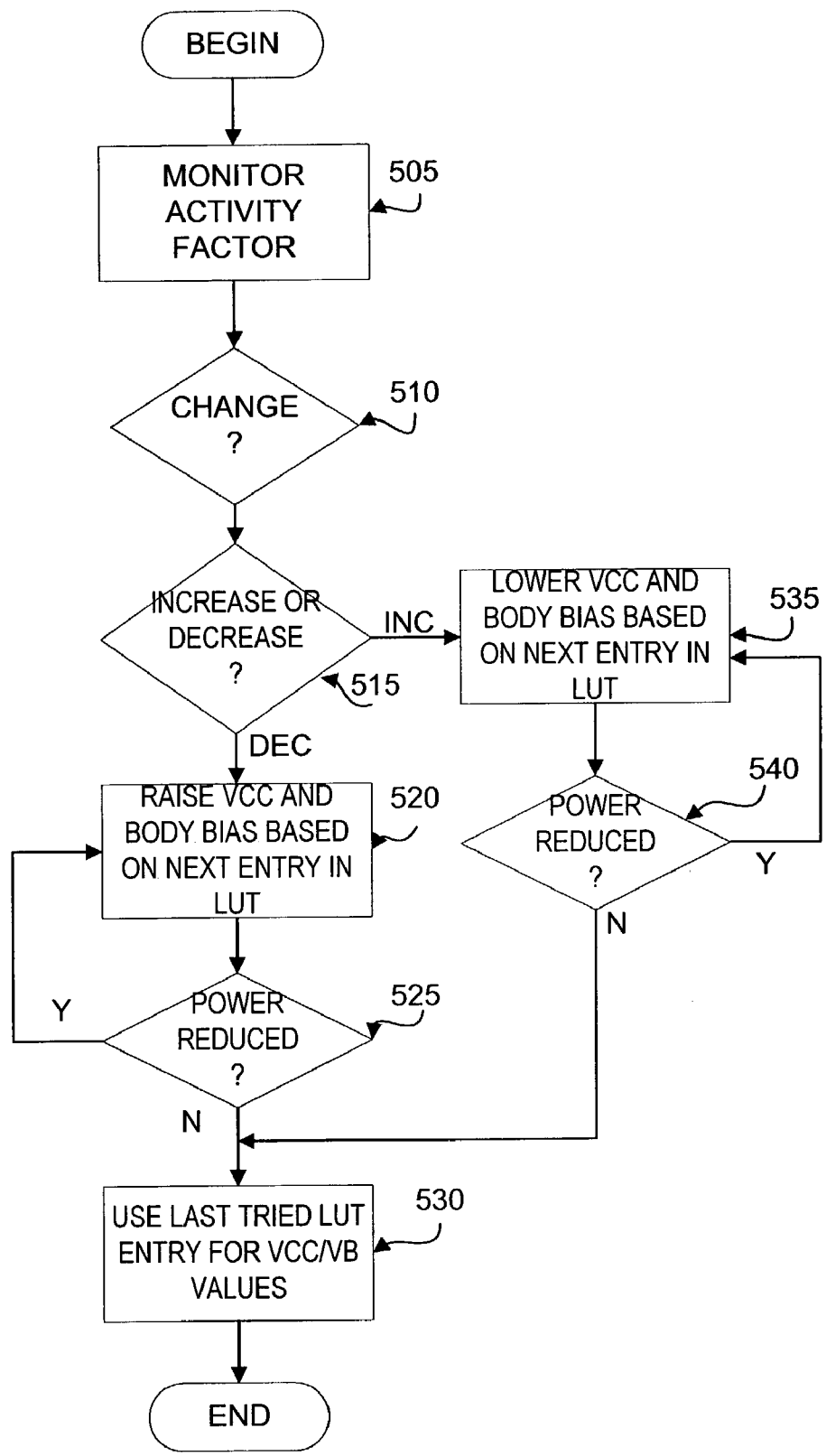
FIG. 5 is a flow diagram showing the power reduction approach of one embodiment using dynamic supply voltage and body bias control.

Referring now to FIGS. 2 and 5, in operation, the activity factor of the processor 205 (or other integrated circuit of interest for other embodiments) is monitored (block 505). Activity factor, as the term is used herein, refers to the activity level of the integrated circuit device of interest, which may be determined using any one of a variety of approaches. Other terms such as activity level, activity indicator, etc. may alternatively be used.

For one embodiment, the current drawn by the processor 205 is used as an indication of the activity factor of the processor 205 and is monitored at regular sample intervals by the current monitor 220, for example, to identify any changes in activity factor for the processor 205. The current detected by the current monitor 220 for each sample period may be compared by the comparator 260 to a previous activity factor stored in an activity factor data store 255 to determine whether there has been a change in the activity factor since the last sample period (block 510). A change may be detected, for example, if a new activity factor is different from a previous activity factor by a predetermined amount. This predetermined amount may be user and/or designer-determined or may depend on the resolution of the current monitor 220 and/or the comparator 260.

If a change in activity factor is detected, the controller 210 causes the supply voltage (Vcc) and transistor threshold voltages (via body bias voltage(s) (Vb)) to be dynamically adjusted with a view to optimizing power consumption while maintaining performance. The manner in which Vcc and Vb are adjusted depends on whether the activity factor has increased or decreased (block 515).

The term "body bias" as used herein refers generally to the bias of a transistor body, either n-type or p-type. For an n-type transistor, the body bias is defined as the difference between the body voltage $Vb_N$ (the voltage of the p-substrate or p-well) and the low supply voltage (e.g. ground). For a p-type transistor, the body bias is defined as the difference between the positive supply voltage (Vcc) and the body voltage $Vb_P$ (the voltage of the n-substrate or n-well). Increasing the body bias, therefore, causes either type of transistor to become more forward-biased or less reverse-biased, thereby reducing the threshold voltage Vth, while decreasing the body bias results in an increase in threshold voltage for n-type and p-type transistors.

In general, for a low activity factor, much of the processor 205 is idle. In such a state, a large portion of the total power consumption of the processor 205 is due to leakage power. Leakage power has an exponential dependence on the threshold voltage(s) of the transistors that make up the processor 205.

Thus, for one embodiment, for relatively low activity factors, leakage power may be significantly reduced by raising the threshold voltages of the processor 205 transistors by applying a reverse body bias. In order to maintain the performance of the processor 205 at a substantially constant level, and to ensure that the processor 205 operates correctly at substantially the same clock frequency (i.e. the frequency at which the processor is targeted to operate), the supply voltage Vcc of the processor is also raised to counteract the effect of the threshold voltage increase. In this manner, the leakage power, which accounts for the largest percentage of the processor 205 power consumption for lower activity factors, is decreased, while the switching power is increased.

In contrast, for a relatively high activity factor, a significant portion of the processor 205 is active such that a large percentage of the processor 205 circuits are switching. For such a state, the power consumption of the processor 205 is dominated by switching power. Switching power has a quadratic dependence on the supply voltage Vcc and, therefore, can be reduced by lowering Vcc. Similarly, in order to maintain the performance of the processor 205 at a substantially constant level, the threshold voltages of the transistors on the processor 205 are also lowered, either by reducing the reverse body bias voltage, or by applying a forward body bias. In this manner, the switching power is reduced, while the leakage power, which is a smaller percentage of the total power consumption for higher activity factors, is increased.

Because the supply voltage Vcc and body bias voltage Vb can be used in this way to trade off switching power and leakage power, for each activity factor that may be identified, there is a combination of Vcc and Vb that causes power consumption to be substantially minimized for a given frequency or performance level. The term "substantially minimized" as used herein means that, for the particular resolutions provided by the Vb generator(s) 250 and the voltage regulator module (VRM) 215, a particular Vcc and Vb (or $Vb_N$ and $Vb_P$) combination of the available Vcc and Vb combinations may produce a lower power consumption level for the processor 205 as compared to power consumption levels that may result from other possible Vcc and Vb combinations.

For one embodiment, the controller 210 determines the adjustments to be applied to Vcc and Vb by accessing data stored in the look-up table (LUT) 245. In order to determine the Vcc and Vb values to be stored in the LUT 245, a characterization operation may be performed. This characterization operation may be performed once for a representative processor and then the results of the characterization may be used to program the look-up tables for all similar processors. The characterization may be performed, for example, for one processor from each manufacturing lot or for one processor manufactured on a particular process. Other approaches for identifying a representative processor may be used for other embodiments.

The characterization operation may involve, for example, varying Vcc and Vb (or $Vb_N$ and $Vb_P$) and measuring associated performance to identify all of the possible Vcc and Vb combinations that meet a desired performance target (i.e. provide proper operation of the processor 205 at the desired frequency). The look-up tables 245 of each similar processor may then be programmed to store the determined Vcc and Vb values.

Figures 3, 4:
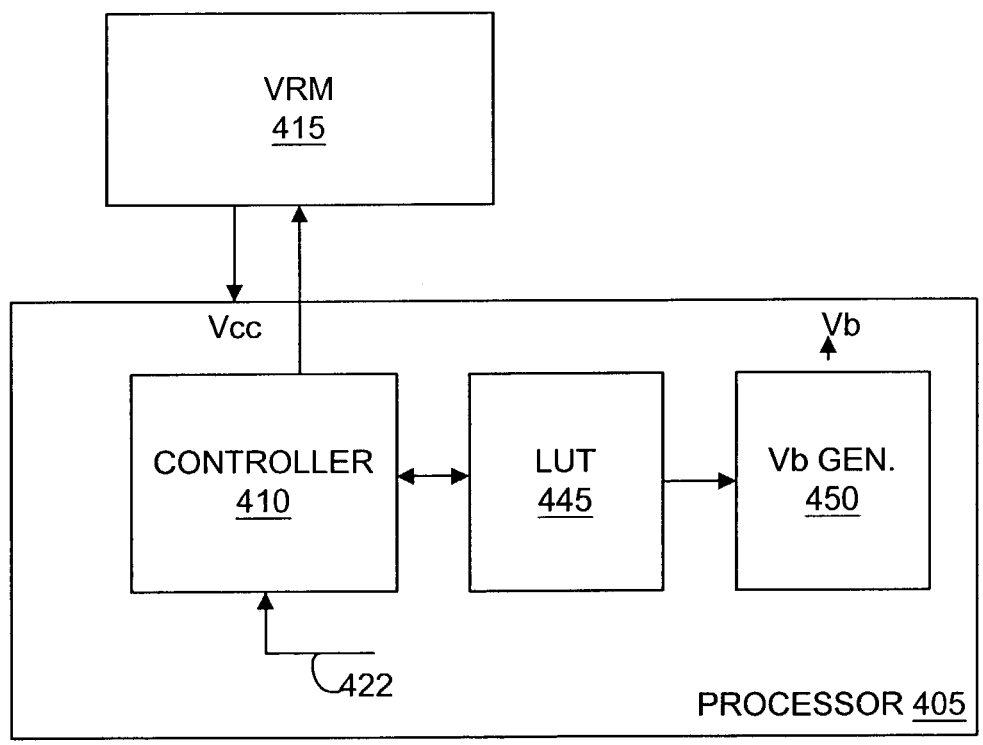
FIG. 3 is a representation of an exemplary look-up table organization that may be used for the power reduction approach shown in FIG. 2.
FIG. 4 is a block diagram of an exemplary system of another embodiment in which the dynamic supply voltage and body bias control approach of one embodiment may be implemented.

For one embodiment, the Vcc and Vb values (or codes that cause the VRM 215 and Vb generator 250 to provide the desired Vcc and Vb values) are stored in ascending order by Vcc level. An exemplary look-up table organization that may be used for the LUT 245 is shown in FIG. 3 for purposes of example. While only one column is shown for Vb, it will be appreciated that, for embodiments for which both $Vb_N$ an $Vb_P$ are dynamically adjusted, an additional column may be provided. Other approaches to organizing the LUT 245 may be used for various embodiments.

For any approach that is used, the number of entries in the LUT 245 may depend on a variety of factors including available storage space, resolution of the Vb generator(s) and/or VRM, and/or other factors.

With continuing reference to FIGS. 2 and 5, if a decrease in activity factor is detected, the supply voltage and threshold voltage should be raised in order to save power (block 520). Assuming, for purposes of example, that the LUT 245 entries are sorted by ascending values of Vcc, the control unit 240 only needs to try Vcc/Vb combinations that are after the current position in the table (i.e. where Vcc is greater than the current Vcc).

For this example, the processor 205 supply voltage Vcc is changed first by the VRM 215 to the value indicated by the LUT 245 in order to raise the supply voltage of the processor 205. Once this change has stabilized, the body bias of the processor 205 is increased as indicated by the LUT 245. By changing the voltages in this order, performance degradation is substantially avoided.

For one embodiment, a predetermined period is provided for stabilization of the supply voltage (or body bias for the case below). For other embodiments, stable voltage levels may be detected using any one of a variety of different well-known approaches.

It is then determined whether the new Vcc and body bias settings result in lower power consumption as compared to the previous settings (block 525). For one embodiment, whether or not the power consumption has been lowered is determined according to the current being drawn by the processor 205 as detected by the current monitor 220. If the new settings result in lower power consumption than the previous settings for Vcc and Vb (or $Vb_N$ and $Vb_P$), the next combination in the LUT 245 is applied. This process is repeated until the next setting leads to a higher power consumption level, at which point, the previous entry is selected as providing the lowest power consumption for the available settings that provide the same performance level (block 530). These new Vcc and Vb settings then provide the new operating point for the processor 205.

In contrast, at block 515, if an increase in activity factor is detected, the supply voltage and threshold voltage should be lowered to reduce leakage. Again, assuming the LUT 245 is sorted by ascending values of Vcc, the control unit 240 selects a Vcc/Vb combination that is immediately prior to the current position in the table 245 (block 535). Where supply voltage and body bias are being decreased, the body bias is decreased first to lower the threshold voltages of the transistors on the processor 205. Once the body bias has stabilized, the supply voltage is changed. The process then proceeds as described above until the combination that provides the lowest power as compared to the other possible combinations indicated by the LUT 245 is identified (blocks 540 and 530).

For another embodiment, the LUT 245 may include an additional field to provide a current or activity factor value for which the Vcc and Vb values provide a low power consumption for a given performance target. Then, in response to detecting a change in activity factor, the Vcc and Vb values associated with the detected current/activity factor, or a current/activity factor close to the detected current/activity factor, are used to select the voltages to be provided by the VRM 215 and the Vb generator(s) 250.

For other embodiments, one or more of the units discussed above may be integrated onto the processor or another type of integrated circuit for which power is to be managed. For example, referring to FIG. 4, a processor 405, which may be essentially similar to the processor 205 described above, may include a control unit 420, a look-up table (LUT) 445 and a body bias (Vb) generator 150, each of which is similar in configuration and operation to the corresponding units discussed above.

For the embodiment shown in FIG. 4, a current monitor may not be provided. Instead, the integrated control unit 420 may receive an activity level indicator signal 422 from other circuitry (not shown) on the processor 405. The activity level indicator signal (or signals) 422 may indicate, for example, the number of functional units on the processor 405 that are currently active (e.g. enabled) and/or which functional units on the processor 405 are currently active. For one embodiment, the activity level indicator signal(s) 422 may be based on or may be provided by signals used for other purposes such as, for example, clock gating.

For the embodiment shown in FIG. 4, the activity level indicator signal(s) may be used to indicate the activity factor of the processor 405. In response to detecting a change in the processor 405 activity factor as indicated by the activity level indicator signal 422, the controller 410 causes a dynamic adjustment to the supply voltage and the body bias(es) of the processor 405 to reduce power as described above.

For the embodiment shown in FIG. 4, values may be stored in the LUT 445 in a similar manner to that described above for the LUT 245 in FIG. 2. Further, the particular Vcc/Vb combination to be used for a particular activity factor to maintain a substantially constant performance level may also be determined in a similar manner as for the embodiment shown in FIG. 2.

Using one or more of the above-described approaches, it may be possible to reduce overall power consumption as compared to prior power reduction approaches, without a need for changes to the operating system and without a user-discernible performance impact.

In the foregoing specification, the invention has been described with reference to specific exemplary embodiments thereof. It will, however, be appreciated that various modifications and changes may be made thereto without departing from the broader spirit and scope of the invention as set forth in the appended claims. For example, while specific circuit modules, look-up table arrangements, and system implementations have been shown, for other embodiments, different circuit modules, look-up table arrangements and system implementations may be used. The specification and drawings are, accordingly, to be regarded in an illustrative rather than a restrictive sense.

What is claimed is:

1. A method comprising:
   detecting a change in an activity factor associated with an integrated circuit device from a first activity factor to a second activity factor; and
   dynamically adjusting a supply voltage and a body bias associated with the integrated circuit device from first supply voltage and body bias values to second, different supply voltage and body bias values based on the second activity factor, dynamically adjusting the supply voltage and the body bias further including maintaining a substantially constant operating frequency.
2. The method of claim 1 wherein,
   detecting the change in the activity factor includes monitoring a current associated with the integrated circuit device.
3. The method of claim 2 wherein,
   monitoring the current includes monitoring a current drawn by the integrated circuit from a voltage supply.
4. The method of claim 1 wherein,
   detecting the change in the activity factor includes monitoring a number of units on the integrated circuit device that are enabled.
5. The method of claim 1 wherein,
   adjusting the supply voltage and the body bias includes accessing a look-up table to set the second supply voltage and body bias values based on the second activity factor.
6. The method of claim 5 wherein,
   if the second activity factor is higher than the first activity factor, adjusting the supply voltage and the body bias includes reducing the supply voltage and the body bias.
7. The method of claim 5 wherein,
   if the second activity factor is higher than the first activity factor and the look-up table is sorted in order of associated supply voltage value, accessing the look-up table includes accessing a first entry in the look-up table that is adjacent to a second entry in the look-up table to store values associated with the first supply voltage and body bias values, the first entry indicating a lower supply voltage than the second entry.
8. The method of claim 7 further comprising:
   determining whether the supply voltage and body bias values indicated by the first entry reduce the power consumption of the integrated circuit.
9. The method of claim 5 wherein,
   if the second activity factor is tower than the first activity factor, adjusting the supply voltage and the body bias includes increasing the supply voltage and the body bias.
10. The method of claim 5 wherein,
    if the second activity factor is lower than the first activity factor and the look-up table is sorted in order of supply voltage value, accessing the look-up table includes accessing a first entry in the look-up table that is adjacent to a second entry in the look-up table to store values associated with the first supply voltage and body bias values, the first entry indicating a higher supply voltage than the second entry.
11. A method comprising:
    detecting a change in an activity factor associated with an integrated circuit device operating at a first frequency;
    dynamically adjusting a supply voltage and a body bias of the integrated circuit from a first supply voltage and first body bias to a second supply voltage and second body bias based on the detected change in activity factor, the second supply voltage and second body bias to cause the integrated circuit device to continue to operate at substantially the first frequency.

12. The method of claim 11 wherein dynamically adjusting the body bias includes dynamically adjusting the body bias of both n-type and p-type transistors on the integrated circuit device.

13. The method of claim 11 wherein dynamically adjusting the body bias includes dynamically adjusting the body bias of one of p-type and n-type transistors on the integrated circuit device.

14. The method of claim 11 further comprising: determining whether applying the second supply voltage and body bias reduces the power consumption of the integrated circuit device as compared to the first supply voltage and body bias voltage.

15. The method of claim 14 further comprising: continuing to dynamically adjust the supply voltage and body bias until a supply voltage and body bias combination is identified that causes the power consumption of the integrated circuit device to be lower as compared to other available supply voltage and body bias combinations.

16. The method of claim 15 wherein dynamically adjusting comprises accessing a look-up table.

17. An apparatus comprising:
a look-up table; and
a supply voltage and body bias control unit to control dynamic adjustment of a supply voltage and a body bias of an integrated circuit device based on an activity factor associated with the integrated circuit device, the supply voltage and body bias control unit to access the look-up table to determine adjustments to the supply voltage and body bias to maintain a substantially constant operating frequency for the integrated circuit device.

18. The apparatus of claim 17 wherein the supply voltage and body bias control unit includes an input to receive a signal indicating an activity factor of the integrated circuit.

19. The apparatus of claim 18 wherein the supply voltage and body bias control unit includes a first output to provide a control signal to a body bias generator and a second output to provide a control signal to a voltage regulator module.

20. The apparatus of claim 17 wherein at least one of the look-up table and the supply voltage and body bias control unit is provided on the integrated circuit device.

21. A system comprising:
a battery to provide an alternate power source;
a processor to operate at a first frequency;
a voltage regulator module to provide a supply voltage to the processor;
a first body bias generator to provide a body bias to a first set of transistors on the processor; and
a dynamic supply voltage and body bias control unit to, in response to detecting a change in an activity factor associated with the processor, dynamically adjust each of the supply voltage and the body bias from first supply voltage and first body bias settings to second supply voltage and second body bias settings that cause the processor to continue to operate at substantially the first frequency.

22. The system of claim 21 further comprising:
a current monitor to indicate the activity factor associated with the processor based on a current drawn by the processor from the voltage regulator module.

23. The system of claim 21 wherein at least one of the first body bias generator and the dynamic supply voltage and body bias control unit is provided on the processor.

24. The system of claim 23 wherein the dynamic supply voltage and body bias control unit is to detect a change in activity factor associated with the processor based on a signal from the processor.

25. The system of claim 21 further comprising:
a second body bias generator wherein the first body bias generator is to control the body bias of one of p-type and n-type transistors on the processor and the second body bias generator is to control the body bias of the other of p-type and n-type transistors, both of the first and second body bias generators to be controlled by the dynamic supply voltage and body bias control unit.

26. The system of claim 25 wherein the dynamic supply voltage and body bias control unit includes a look-up table to store values associated with supply voltage and body bias combinations that enable the processor to operate at the first frequency, the dynamic supply voltage and body bias control unit to select an entry in the look-up table that results in lower power operation for the processor.

27. The system of claim 21 wherein the dynamic supply voltage and body bias control unit includes a look-up table to store values associated with supply voltage and body bias combinations that enable the processor to operate at the first frequency, the dynamic supply voltage and body bias control unit to select an entry in the look-up table that results in lower power operation for the processor.

* * * * *